(12) United States Patent
Kumar et al.

(10) Patent No.: US 8,097,917 B2
(45) Date of Patent: Jan. 17, 2012

(54) SILICON CARBIDE SEMICONDUCTOR DEVICE

(75) Inventors: Malhan Rajesh Kumar, Nagoya (JP); Yuichi Takeuchi, Obu (JP)

(73) Assignee: DENSO CORPORATION, Kariya (JP)

( * ) Notice: Subject to any disclaimer, the term of this patent is extended or adjusted under 35 U.S.C. 154(b) by 90 days.

(21) Appl. No.: 12/458,377

(22) Filed: Jul. 9, 2009

(65) Prior Publication Data

US 2009/0272983 A1 Nov. 5, 2009

Related U.S. Application Data (62) Division of application No. 11/268,771, filed on Nov. 8, 2005, now Pat. No. 7,582,932.

(30) Foreign Application Priority Data

Nov. 8, 2004 (JP) .................. 2004-323512
Oct. 7, 2005 (JP) .................. 2005-294915

(51) Int. Cl.
 *H01L 29/66* (2006.01)

(52) U.S. Cl. ... 257/332; 257/77; 257/330; 257/E21.382; 257/E29.066; 257/E29.197; 257/E29.198; 257/E29.2; 257/E29.201; 257/E29.257; 257/E29.26; 257/E29.262

(58) Field of Classification Search ............ 257/77, 257/330, 332, E21.382, E29.066, E29.197, 257/E29.198, E29.2, E29.201, E29.257, E29.26, 257/E29.262

See application file for complete search history.

(56) References Cited

U.S. PATENT DOCUMENTS

| | | | |
|---|---|---|---|
| 5,323,040 A | 6/1994 | Baliga | |
| 5,637,898 A | 6/1997 | Baliga | |
| 5,693,569 A | 12/1997 | Ueno | |
| 5,723,882 A | 3/1998 | Okabe et al. | |
| 5,744,826 A | 4/1998 | Takeuchi et al. | |
| 5,773,849 A | 6/1998 | Harris et al. | |
| 6,057,558 A | 5/2000 | Yamamoto et al. | |
| 6,570,185 B1 | 5/2003 | Tan | |
| 6,600,193 B2 | 7/2003 | Darwish | |
| 2003/0042538 A1 | 3/2003 | Kumar et al. | |
| 2004/0113202 A1 | 6/2004 | Kocon et al. | |
| 2005/0029586 A1 | 2/2005 | Ono et al. | |
| 2006/0118818 A1 | 6/2006 | Shimoida et al. | |

FOREIGN PATENT DOCUMENTS

| | | |
|---|---|---|
| JP | A-170263 | 9/1985 |
| JP | A-204789 | 7/1999 |
| JP | A-2001-77358 | 3/2001 |
| JP | A-2002-176177 | 6/2002 |

(Continued)

OTHER PUBLICATIONS

Official Letter dated Oct. 10, 2007 in corresponding Swedish patent application No. 0502464-1 (English translation enclosed).

(Continued)

*Primary Examiner* — Jay C Kim
(74) *Attorney, Agent, or Firm* — Posz Law Group, PLC (57) ABSTRACT

A silicon carbide semiconductor device includes: a semiconductor substrate having a silicon carbide substrate, a first semiconductor layer, a second semiconductor layer, and a third semiconductor layer; a trench penetrating the second and the third semiconductor layers to reach the first semiconductor layer; a channel layer on a sidewall and a bottom of the trench; an oxide film on the channel layer; a gate electrode on the oxide film; a first electrode connecting to the third semiconductor layer; and a second electrode connecting to the silicon carbide substrate. A position of a boundary between the first semiconductor layer and the second semiconductor layer is disposed lower than an utmost lowest position of the oxide film.

5 Claims, 10 Drawing Sheets

FOREIGN PATENT DOCUMENTS

JP        A-2003-152182        5/2003

OTHER PUBLICATIONS

Office Action dated Nov. 14, 2007 in corresponding U.S. Appl. No. 11/268,771.
Office Action dated Dec. 28, 2007 in corresponding Chinese Patent Application No. 200510116265.9 (English translation enclosed).
Office Action dated Jul. 11, 2008 in corresponding Chinese Patent Application No. 200510116265.9 (English translation enclosed).
Office Action dated Aug. 14, 2008 in corresponding U.S. Appl. No. 11/268,771.
Office Action dated Oct. 7, 2008 in corresponding U.S. Appl. No. 11/268,771.
Office Action dated Nov. 13, 2008 in corresponding U.S. Appl. No. 11/826,070.
Office Action dated Dec. 22, 2008 in corresponding Swedish Patent Application No. 0502464-1 (English translation enclosed).
Office Action dated Feb. 9, 2009 in corresponding U.S. Appl. No. 11/268,771.
Notice of Reason for Refusal mailed Sep. 13, 2011 in corresponding Jp application No. 2005-294915 (and English translation).

SILICON CARBIDE SEMICONDUCTOR DEVICE

CROSS REFERENCE TO RELATED APPLICATIONS

This application is a division of U.S. application Ser. No. 11/268,771 filed on Nov. 8, 2005, now U.S. Pat. No. 7,582,932 which is based on Japanese Patent Applications No. 2004-323512 filed on Nov. 8, 2004, and No. 2005-294915 filed on Oct. 7, 2005, the disclosures of which are incorporated herein by reference. This application is also related to U.S. application Ser. No. 11/826,070 filed on Jul. 12, 2007, now U.S. Pat. No. 7,541,300, which also was a division of U.S. application Ser. No. 11/268,771.

FIELD OF THE INVENTION

The present invention relates to a silicon carbide semiconductor device and method for manufacturing a silicon carbide semiconductor device.

BACKGROUND OF THE INVENTION

SiC is a semiconductor material, which is superior to Si in view of physical properties and electric properties, although currently predominant material is Si. Specifically, a forbidden band width of SiC is three times wider than that of Si, dielectric breakdown voltage of SiC is seven times larger than that of Si, and thermal conductivity of SiC is three times larger than that of Si. Therefore, SiC is expected to be a semiconductor material for performing a high power and super-low energy loss device for the next generation.

A trench type vertical power MOSFET using SiC is disclosed in, for example, U.S. Pat. No. 6,570,185. A cross sectional construction of this power MOSFET is shown in FIG. 16.

Figure 16:
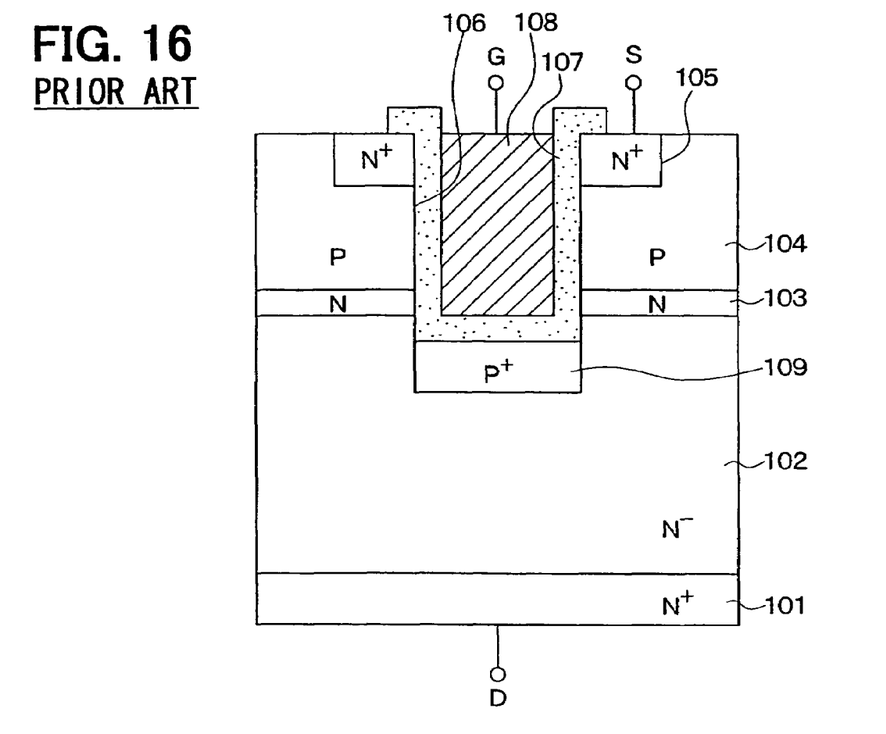
FIG. 16 is a cross sectional view showing a vertical power MOSFET according to a prior art.

As shown in FIG. 16, in the power MOSFET, a N$^-$ type drift layer 102 is formed on a surface of a N$^+$ type SiC substrate 101. A N type region 103 and a P type base region 104 are formed on the N$^-$ type drift layer 102 in this order. Further, a N$^+$ type source region 105 is formed on a surface portion of the P type base region 104. Furthermore, a trench 106 is formed to penetrate the N$^+$ type source region 105, the P type base region 104 and the N type region 103 and to reach the N$^-$ type drift layer 102. A gate electrode 108 is formed in the trench 106 through a gate oxide film 107. A P$^+$ type layer 109 is formed on a bottom of the trench 106.

In the power MOSFET having the above construction, since the P$^+$ layer 109 is formed on the bottom of the trench 106, current flowing through a channel to be formed in the P type base region 104 flows through the N type region 103 when a voltage is applied to the gate electrode 108. Thus, an on-state resistance of the power MOSFET can be reduced, compared with a case where a device has no N type region 103. This is because the N type region 103 has high impurity concentration, i.e., the N type region 103 has low resistance.

Further, since the P$^+$ type layer 109 is formed on the bottom of the trench 106, electric field concentration is prevented from generating at a corner portion between the bottom of the trench and the sidewall of the trench. Thus, the gate oxide film 107 at that portion is protected from being destroyed.

However, when the P$^+$ type layer 109 is formed on the bottom of the trench 106, it is required to separate a distance between the P$^+$ type layer 109 and the P type base region 104 because of electrical separation therebetween, or it is required to form the N type layer 103 under the P type base region 104, as shown in FIG. 16. Therefore, in the former case, the depth of the trench becomes larger. In the latter case, an additional process is required to form the N type layer 103.

SUMMARY OF THE INVENTION

In view of the above-described problem, it is an object of the present invention to provide a SiC semiconductor device and a method for manufacturing the same.

A silicon carbide semiconductor device includes: a semiconductor substrate including a silicon carbide substrate having a first conductivity type or a second conductivity type, a first semiconductor layer made of first conductivity type silicon carbide and having an impurity concentration lower than that of the silicon carbide substrate, a second semiconductor layer made of second conductivity silicon carbide, and a third semiconductor layer made of the first conductivity type silicon carbide, which are stacked in this order; a trench disposed in a cell region of the semiconductor substrate and penetrating the second and the third semiconductor layers to reach the first semiconductor layer; a channel layer having the first conductivity type and disposed on a sidewall and a bottom of the trench; an oxide film disposed on the channel layer in the trench and including a part for functioning as a gate oxide film; a gate electrode disposed on a surface of the oxide film in the trench; a first electrode electrically connecting to the third semiconductor layer; and a second electrode electrically connecting to the silicon carbide substrate. A position of a boundary between the first semiconductor layer and the second semiconductor layer is disposed lower than an utmost lowest position of the oxide film in the trench.

In the above construction, the second semiconductor layer disposed on both sides of the trench is disposed lower than the utmost lowest position of the oxide film. Therefore, a junction structure is provided, in which a channel layer having the first conductivity type is sandwiched on both sides of the channel layer between two second semiconductor layers having the second conductivity type. Accordingly, electric potential of the drain is interrupted by the junction structure so that it is difficult for the depletion layer to penetrate to an upper portion of the channel layer.

Accordingly, electric field concentration is prevented from generating at a corner between the bottom and the sidewall of the trench. Thus, the oxide film at the corner can be protected from breaking down.

Further, this construction can be provided only by entrenching the trench near the boundary between the first semiconductor layer and the second semiconductor layer. Therefore, the depth of the trench does not become larger. Furthermore, it is not required to form a N type layer under a P$^+$ type base region. Thus, no additional process is required, so that a manufacturing process of a vertical type power MOSFET is simplified.

Thus, in the device, a base region and a layer having the same conductivity type as the base region disposed under a trench are electrically separated each other. Further, a manufacturing process of the device can be simplified.

Alternatively, an impurity concentration of a second conductivity type second impurity in the second semiconductor layer is gradually reduced from a height of a position of the oxide film disposed on a bottom of the trench to a boundary between the first semiconductor layer and the second semiconductor layer, and an impurity concentration of a first conductivity type impurity in the channel layer is higher than an impurity concentration of the first conductivity type impurity in the first semiconductor layer. In the above construction, it is possible to improve withstand voltage with maintaining a threshold of the gate channel.

Alternatively, the device further includes a low resistance layer having the first conductivity type and formed under the oxide film on a bottom of the trench. A length from the utmost lowest position of the oxide film to the bottom of the trench corresponds to a sum of a film thickness of the low resistance layer and a film thickness of the channel layer.

Thus, the device includes the low resistance layer having the first conductivity type and formed under the oxide film on the bottom of the trench. Therefore, since current flows through the low resistance layer, an on-state resistance of the silicon carbide semiconductor device is reduced. Further, in this construction, the length from the utmost lowest position of the oxide film to the bottom of the trench becomes equal to the sum of the film thickness of the low resistance layer and the film thickness of the channel layer.

Here, a plane orientation of the sidewall of the trench is set to be a (1-100)-surface or a (11-20)-surface, and a thickness of a part of the channel layer disposed on the bottom of the trench is designed to be larger than that disposed on the sidewall of the trench.

In this case, for example, the thickness of the part of the channel layer formed on the bottom of the trench is once to five times larger than that formed on the sidewall of the trench. Further, a dopant concentration of a first conductivity type impurity in the part of the channel layer formed on the sidewall of the trench is once to five times larger than that formed on the bottom of the trench.

Alternatively, the device has a construction that: the silicon carbide substrate has the first conductivity type; a plurality of trenches are formed in the substrate, each trench being disposed from a backside of the silicon carbide substrate to the first semiconductor layer; the trenches are embedded with an impurity layer having the second conductivity type; and the second electrode contacts the silicon carbide substrate and the impurity layer.

When the silicon carbide semiconductor device is an IGBT, the silicon carbide substrate has the first conductivity type, multiple trenches are formed in the substrate, and each trench is embedded with the impurity layer having the second conductivity type, a threshold of a PN potential can be eliminated.

Alternatively, the silicon carbide substrate has the second conductivity type, multiple trenches are formed in the substrate to be disposed from the backside of the silicon carbide substrate to the first semiconductor layer, and each trench is embedded with the impurity layer having the first conductivity type.

A method for manufacturing a silicon carbide semiconductor device includes the steps of: preparing a semiconductor substrate including a silicon carbide substrate having a first conductivity type or a second conductivity type, a first semiconductor layer made of first conductivity type silicon carbide and having an impurity concentration lower than that of the silicon carbide substrate, a second semiconductor layer made of second conductivity type silicon carbide, and a third semiconductor layer made of the first conductivity type silicon carbide, which are stacked in this order; forming a trench in a cell region of the semiconductor substrate, the trench penetrating the second and the third semiconductor layers to reach the first semiconductor layer; forming a fourth semiconductor layer having the first conductivity type in the trench by an epitaxial growth method in such a manner that a part of the fourth semiconductor layer disposed on a bottom of the trench is thicker than that on a sidewall of the trench; forming an oxide film on an inner wall of the trench by a thermal oxidation method in such a manner that the oxide film includes a part for functioning as a gate oxide film, which contacts the fourth semiconductor layer, so that the fourth semiconductor layer provides a channel layer; forming a gate electrode on a surface of the oxide film in the trench; forming a first electrode electrically connecting to the third semiconductor layer; and forming a second electrode electrically connecting to the silicon carbide substrate. In the step of forming the oxide film, the thermal oxidation method is performed so that a position of a boundary between the first semiconductor layer and the second semiconductor layer is disposed lower than an utmost lowest position of the oxide film in the trench.

The above method provides the following SiC device. In the device, electric potential of the drain is interrupted by the junction structure so that it is difficult for the depletion layer to penetrate to an upper portion of the channel layer. Thus, the oxide film at the corner can be protected from breaking down. Further, this construction can be provided only by entrenching the trench near the boundary between the first semiconductor layer and the second semiconductor layer. Furthermore, it is not required to form a N type layer under a $P^+$ type base region. Thus, no additional process is required, so that a manufacturing process of a vertical type power MOSFET is simplified.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
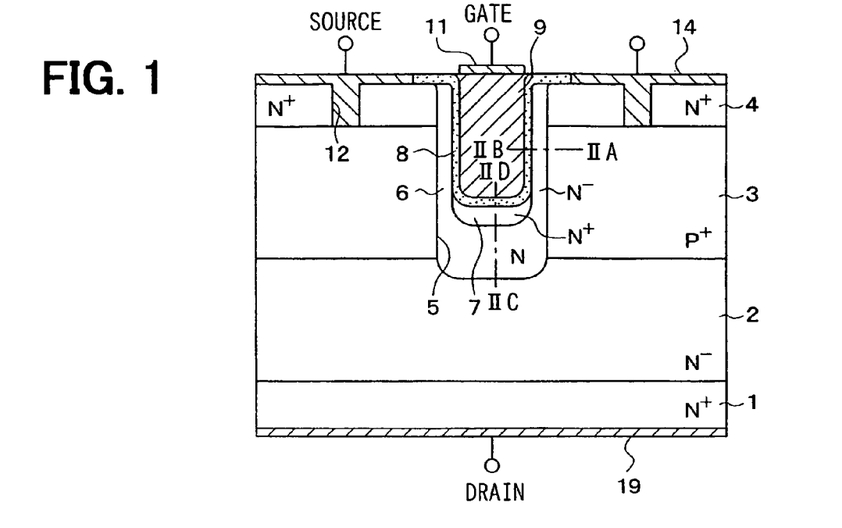
FIG. 1 is a cross sectional view showing an accumulation type vertical power MOSFET according to a first embodiment of the present invention.

FIG. 1 shows a cross sectional view of a cell region of a trench type vertical power MOSFET as an accumulation type MOSFET according to a first embodiment of the present invention. The construction of the vertical power MOSFET shown in FIG. 1 is explained.

An $N^-$ type drift layer 2 is disposed on an $N^+$ type substrate 1. A $P^+$ type base region 3 and an $N^+$ type source region 4 are formed on the surface of the $N^-$ type drift layer 2. In this embodiment, a semiconductor substrate is composed of the $N^+$ type substrate 1, the $N^-$ type drift layer 2, the $P^+$ type base region 3 and the $N^+$ type source region 4.

A trench 5 is formed to penetrate the $N^+$ type source region 4 and the $P^+$ type base region 3 and to reach the $N^-$ type drift layer 2. An $N^-$ type channel layer 6 is formed on an inner wall of the trench 5. An $N^+$ type low resistance layer 7 is formed on a surface portion of the $N^-$ type channel layer 6 disposed on the bottom of the trench 5.

An oxide film 8 is formed to cover the $N^-$ type channel layer 6, the $N^+$ type low resistance layer 7 and a part of the $N^+$ type source region 4. A part of the oxide film 8, which is disposed in the trench 5, i.e., formed on the sidewall of the trench 5, functions as a gate oxide film. A gate electrode 9 is formed on the surface of the part of the oxide film 8, which functions as the gate oxide film. The gate electrode 9 is made of poly silicon or metal. The trench 5 is embedded with the gate electrode 9.

A gate wiring 11 is formed on the gate electrode 9 through an interlayer, insulation film not shown in FIG. 1. The gate wiring 11 is electrically connected to the gate electrode 9.

Another trench 12 for contact is formed in a part of the substrate. The part is different from a part of the substrate, in which the trench 5 is formed. The contact trench 12 penetrates the $N^+$ type source region 4 and reaches the $P^+$ type base region 3. The first electrode 14 for providing a source electrode is formed on the contact trench 12 for contact. The first electrode 14 is electrically connected to the $P^+$ type base region 3 and the $N^+$ type source region 4 through an interlayer insulation film not shown and the contact trench 12.

Further, the second electrode 19 is formed on the backside of the $N^+$ type substrate 1. The second electrode 19 functions as a drain electrode.

The trench type vertical power MOSFET according to this embodiment is constructed in the above construction. In this construction, impurity concentration and dimensions of each part in the vertical power MOSFET are described as follows.

A dopant concentration of the $N^+$ type substrate 1 is $1\times10^{19}$ $cm^{-3}$, the dopant concentration of the $N^-$ type drift is $5\times10^{15}$ $cm^{-3}$, the dopant concentration of the $P^+$ type base region 3 is $5\times10^{18}$ $cm^{-3}$, and the dopant concentration of the $N^+$ type source region 4 is $1\times10^{20}$ $cm^{-3}$.

A sum of thickness of the $P^+$ type base region 3 and the $N^+$ type source region 4 is a little smaller than a dimension of the trench 5 in a depth direction. However, the sum is substantially equal to the dimension of the trench 5, and they are, for example, 4 μm to 5 μm.

Figure 2A:
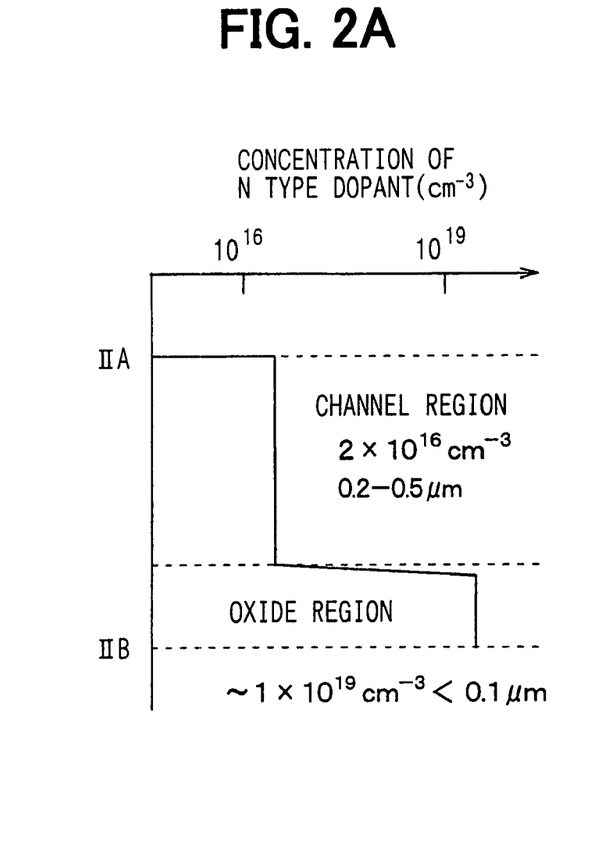
FIG. 2A is a graph showing a profile of a dopant concentration of a N type impurity and a thickness of a $N^-$ type channel layer taken along line IIA-IIB in FIG. 1.
Figure 2B:
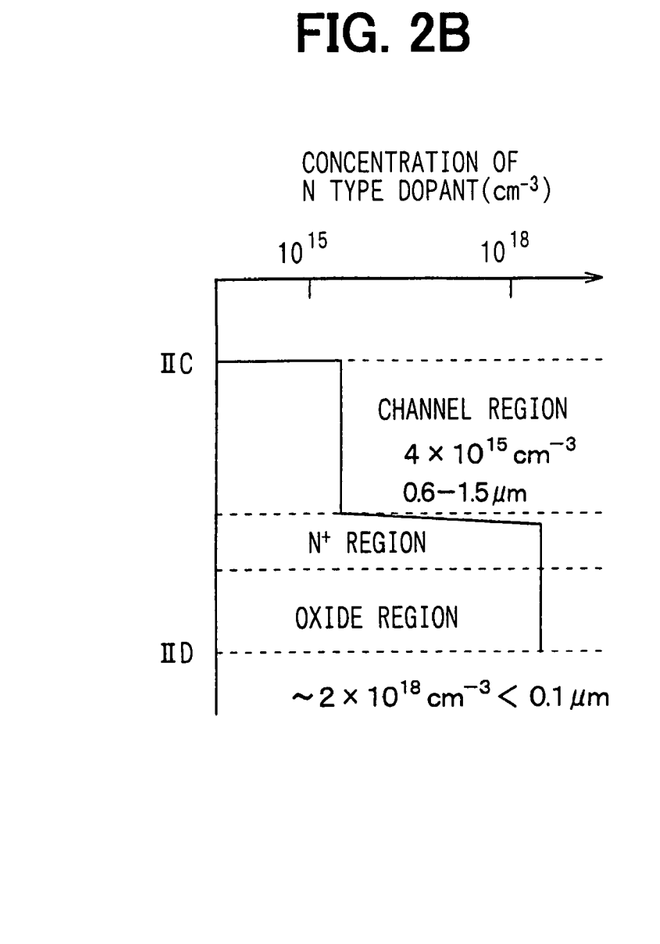
FIG. 2B is a graph showing a profile of a dopant concentration of a $N^+$ type low resistance layer and an oxide film taken along line IIC-IID in FIG. 1.

The $N^-$ type channel layer 6, the $N^+$ type low resistance layer 7 and the oxide film 8 are explained with reference to FIGS. 2A and 2B. FIGS. 2A and 2B show a profile of a film thickness and a dopant concentration of a N type impurity in each of the $N^-$ type channel layer 6, the $N^+$ type low resistance layer 7 and the oxide film 8 taken along with line IIA-IIB and line IIC-IID in FIG. 1, respectively.

On line IIA-IIB in FIG. 1, the thickness of the $N^-$ type channel layer 6 is 0.2 μm to 0.5 μm, and the impurity concentration is $1\times10^{16}$ $cm^{-3}$ to $1\times10^{17}$ $cm^{-3}$. For example, as shown in FIG. 2A, the impurity concentration of the $N^-$ type channel layer 6 is $2\times10^{16}$ $cm^{-3}$ in this embodiment. The thickness of the oxide film 8 is equal to or smaller than 0.1 μm, and the impurity concentration is equal to or larger than $1\times10^{17}$ $cm^{-3}$. For example, as shown in FIG. 2A, the impurity concentration of the oxide film 8 is $1\times10^{19}$ $cm^{-3}$ in this embodiment. On line IIC-IID in FIG. 1, the thickness of the $N^-$ type channel layer 6 is 0.6 μm to 1.5 μm, and the impurity concentration is $2\times10^{15}$ $cm^{-3}$ to $2\times10^{16}$ $cm^{-3}$. For example, as shown in FIG. 2B, the impurity concentration of the $N^-$ type channel layer 6 is $4\times10^{15}$ $cm^{-3}$ in this embodiment. The thickness of the $N^+$ type low resistance layer 7 is equal to or smaller than 0.2 μm, and the impurity concentration is equal to or larger than $2\times10^{16}$ $cm^{-3}$. For example, as shown in FIG. 2B, the impurity concentration of the $N^+$ type low resistance layer 7 is $2\times10^{18}$ $cm^{-3}$ in this embodiment. The thickness of the oxide film 8 is equal to or smaller than 1 μm, and the impurity concentration is equal to or larger than $2\times10^{16}$ $cm^{-3}$. For example, as shown in FIG. 2B, the impurity concentration of the oxide film 8 is $2\times10^{18}$ $cm^{-3}$ in this embodiment.

Thus, in the vertical power MOSFET according to this embodiment, a length from the utmost lowest position of the oxide film 8 in the trench 5 (i.e., a surface facing the bottom of the trench 5) to the bottom of the trench 5 is larger than a length from a part of the oxide film 8 for functioning as the gate oxide film to the sidewall of the trench 5. Specifically, the length from the utmost lowest position of the oxide film 8 to the bottom of the trench 5 is equal to a sum of length of the thickness of the $N^-$ type channel layer 6 and the thickness of the $N^+$ type low resistance layer 7. They are, for example, 0.8 μm to 1.7 μm. Further, the length from the part of the oxide film 8 for functioning as the gate oxide film to the sidewall of the trench 5 is equal to the thickness of the $N^-$ type channel layer 6 disposed on the sidewall of the trench 5. They are, for example, 0.2 μm to 0.5 μm.

In this vertical power MOSFET having the above construction, when a voltage is applied to the gate electrode 9, an accumulation type channel region is formed in the N⁻ type channel layer 6. Current flows between the first electrode 14 and the second electrode 19 through this channel region.

Figure 3:
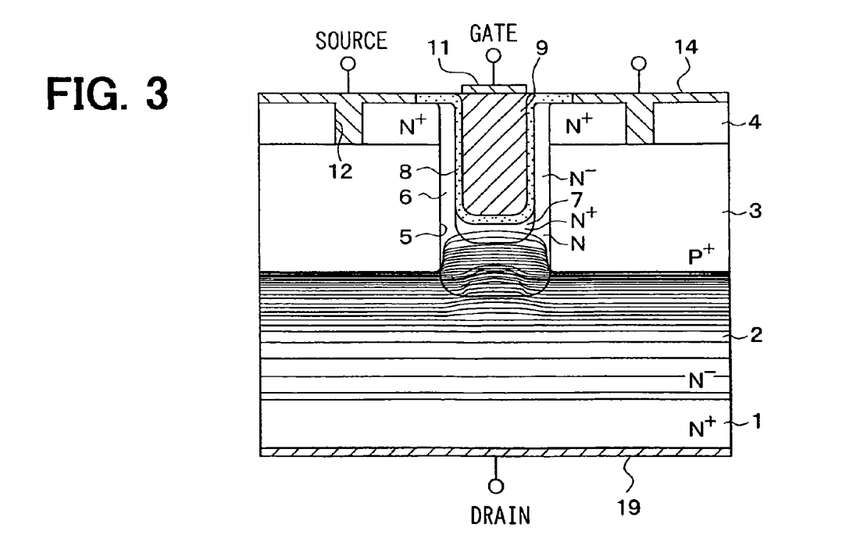
FIG. 3 is a cross sectional view showing equipotential lines in the vertical power MOSFET in case of an off-state.

In this vertical power MOSFET according to this embodiment, the P⁺ type base region 3 disposed on both sides of the trench 5 is positioned lower than the utmost lowest position of the oxide film 8. Accordingly, a junction structure is provided. In the junction structure, the N⁻ type channel layer 6 is sandwiched between two P⁺ type base regions 3 from both sides of the channel layer 6 on the bottom of the trench 5. Therefore, as shown in FIG. 3, electric potential of the drain is interrupted by the junction structure in case of off-state, so that it is difficult for the depletion layer to penetrate to an upper portion of the N⁻ type channel layer 6.

Accordingly, electric field concentration is prevented from generating at a corner between the bottom and the sidewall of the trench 5. Thus, it is possible to protect the oxide film 8 at the corner from breaking down.

Further, the constitution according to this embodiment can be provided only by entrenching the trench 5 near the boundary between the N⁻ type drift layer 2 and the P⁺ type base region 3. Thus, the depth of the trench 5 is not increased excessively. Further, it is not required to form a N type layer under the P⁺ type base region 3 like as the prior art. Therefore, no additional process for forming the N type layer is necessitated. Thus, the manufacturing process of the vertical power MOSFET can be simplified.

Next, the manufacturing method of the vertical power MOSFET according to this embodiment is explained with reference to the manufacturing process drawings of the vertical power MOSFET shown in FIGS. 4 to 9.

Figure 4:
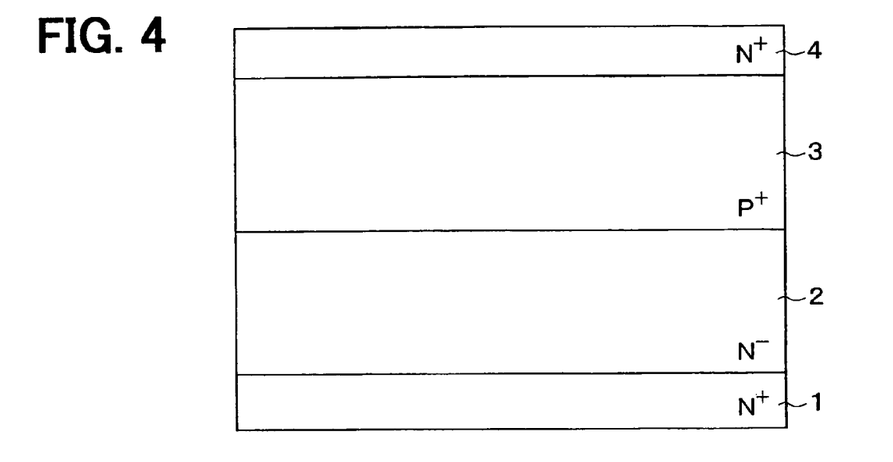
FIG. 4 is a cross sectional view explaining a manufacturing process of the vertical power MOSFET according to the first embodiment.

<Step Shown in FIG. 4>

Firstly, a substrate is prepared. In the substrate, the N⁻ type drift layer 2, the P⁺ type base region 3 and the N⁺ type source region 4 are epitaxially grown on the surface of the N⁺ type substrate 1 having a principal plane of a [1-100]-offset surface. For example, the dopant concentration of the N⁺ type substrate 1 is $1 \times 10^{19}$ cm⁻³, the dopant concentration of the N⁻ type drift layer 2 is $5 \times 10^{15}$ cm⁻³, the dopant concentration of the P⁺ type base region 3 is $5 \times 10^{18}$ cm⁻³, and the dopant concentration of the N⁺ type source region 4 is $1 \times 10^{20}$ cm⁻³. The surface of the substrate is the [1-100]-offset surface, since each layer takes over the surface state of the N⁺ type substrate 1.

Figure 5:
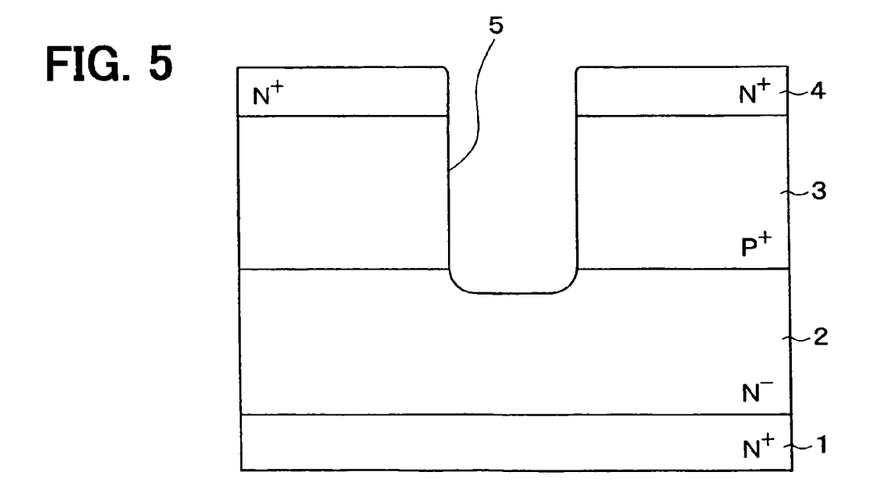
FIG. 5 is a cross sectional view explaining the manufacturing process of the vertical power MOSFET subsequent to FIG. 4.

<Step Shown in FIG. 5>

A mask having an opening disposed at a position corresponding to a trench-to-be-formed portion of the surface of the substrate is prepared. The substrate is etched through the mask by about 4 μm to 5 μm. Thus, the trench 5 is formed. At this time, for example, the layout of the mask is set in such a manner that the sidewall of the trench coincides with a (1-100)-surface or a (11-20)-surface.

Figure 6:
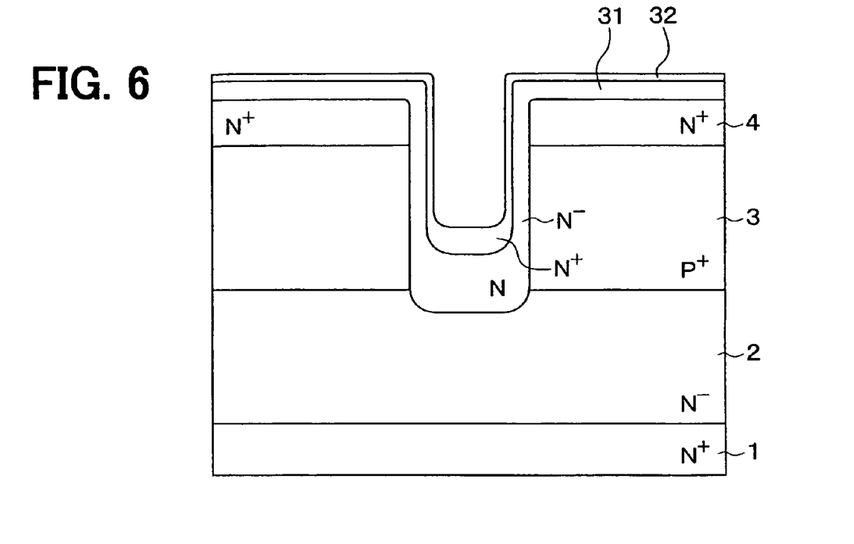
FIG. 6 is a cross sectional view explaining the manufacturing process of the vertical power MOSFET subsequent to FIG. 5.

<Step Shown in FIG. 6>

After the mask using in the step of forming the trench 5 is removed, the N⁻ type layer 31 is formed by a CVD method. Subsequently, the N⁺ type layer 32 is formed. For example, the N⁻ type layer 31 and the N⁺ type layer 32 are formed under the condition that a temperature is 1600° C., a growth rate is 1.0 μm per hour, an introduction rate of raw material gas of C and Si is equal to or smaller than 1.0. At this time, for example, a nitrogen gas is introduced into atmosphere so that an impurity of N is introduced into the N⁻ type layer 31 and the N⁺ type layer 32.

Thus, the N⁻ type layer 31 having the dopant concentration of, for example, $1 \times 10^{16}$ cm⁻³, and the N⁺ type layer 32 having the dopant concentration of, for example, $1 \times 10^{20}$ cm⁻³ are formed on the inner wall of the trench 5.

In this case, regarding the trench 5, the thickness and the dopant concentration of each of the N⁻ type layer 31 and the N⁺ type layer 32, which are formed on the bottom of the trench 5, on the sidewall of the trench 5 or on the surface of the substrate, are different each other. Specifically, the thickness of a part of each impurity layer formed on the sidewall of the trench 5 is thinner than that formed on the bottom of the trench 5, and the dopant concentration of the part of each impurity layer formed on the sidewall of the trench 5 is higher than that formed on the bottom of the trench 5. Further, the thickness of a part of each impurity layer formed on the bottom of the trench 5 is thicker than that formed on the surface of the substrate.

The reason why the above relationships are designed is such that it is difficult to deposit the impurity layer on the sidewall of the trench 5 rather than on the bottom of the trench 5. Further, this is because the deposition amount of the impurity layer on the bottom of the trench 5 becomes larger than that on the surface of the substrate, since a part of the impurity layer, which does not deposit on the sidewall of the trench 5, deposits on the bottom of the trench 5.

Figure 10:
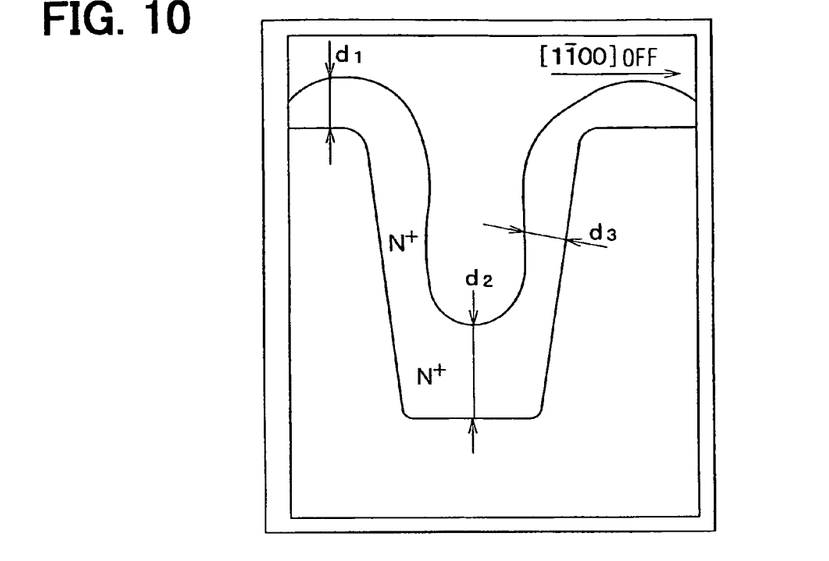
FIG. 10 is a cross sectional view explaining a relationship between thicknesses of the $N^-$ type layer and the $N^+$ type layer in the vertical power MOSFET according to the first embodiment.

In this case, a relationship between the thickness and the dopant concentration depends on a plane orientation of the surface of the substrate and a plane orientation of the sidewall of the trench 5. In this embodiment, it is defined to have the following relationship. FIG. 10 is a schematic view explaining the relationship.

Regarding the thicknesses of the N⁻ type layer 31 and the N⁺ type layer 32, as shown in FIG. 10, the thickness of the impurity layer formed on the bottom of the trench 5 is defined as d2, the thickness of the impurity layer formed on the surface of the substrate is defined as d1, and the thickness of the impurity layer formed on the sidewall of the trench 5 is defined as d3. It is confirmed that these thicknesses have the following relationships.

$$d2 = 2 \times d1 \quad \text{(Formula 1)}$$

$$d2 = 3 \times d3 \quad \text{(Formula 2)}$$

Here, the above relationships of thickness may change in accordance with a deposition condition and the like. For example, Formula 2 shows that the thickness d2 becomes three times larger than the thickness d3. Actually, the thickness d2 is from once to five times larger than the thickness d3. Since the growth rate of the N⁻ type layer 31 and the N⁺ type layer 32 on the sidewall of the trench 5 is, for example, 100 nm per hour, and the growth rate of them on the bottom of the trench 5 is 100 nm to 500 nm per hour, the above relationship is obtained.

Further, regarding the dopant concentration of the N⁻ type layer 31 and the N⁺ type layer 32, the concentration of a part of formed on the sidewall of the trench 5 is once to five times larger than the concentration of a part formed on the bottom of the trench 5.

Figure 7:
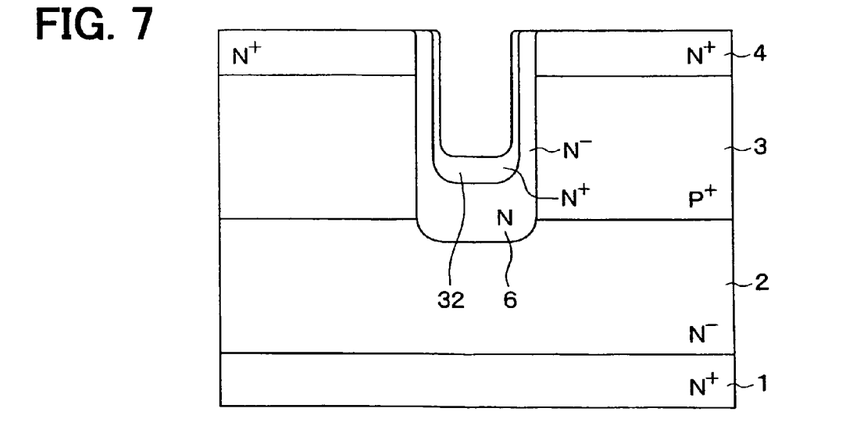
FIG. 7 is a cross sectional view explaining the manufacturing process of the vertical power MOSFET subsequent to FIG. 6.

<Step Shown in FIG. 7>

By performing an etch back process, a part of the N⁻ type layer 31 and the N⁺ type layer formed on the surface of the substrate is removed. Thus, the N⁺ type source region 4 is exposed, and further, the N⁻ type layer 31 remained in the trench 5 provides the N⁻ type channel layer 6.

Figure 8:
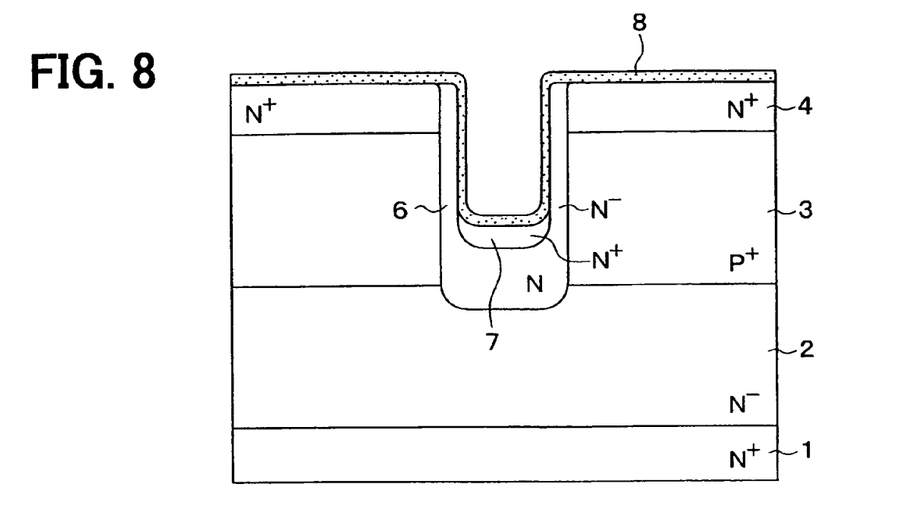
FIG. 8 is a cross sectional view explaining the manufacturing process of the vertical power MOSFET subsequent to FIG. 7.

<Step Shown in FIG. 8>

A sacrifice oxidation process and the like are performed if necessary. After that, the N⁺ type layer 32 is oxidized in a thermal oxidation process, so that the oxide film 8 doping with the N type impurity is formed. The concentration of the N type impurity doped in the oxide film 8 is generally equal to the concentration of the N type impurity included in the N+ type layer 32 to be oxidized.

At this time, a process time and a process temperature of the thermal oxidation process are controlled so that a part of the N+ type layer 32 formed on the sidewall of the trench 5 is completely oxidized. Thus, the N− type channel layer 6 and the oxide film 8 are remained on the sidewall of the trench, and the N+ type layer 32 is disappeared. Not only the N− type channel layer 6 and the oxide film 8 but also the N+ type layer 32 is remained on the bottom of the trench 5. This N+ type layer 32 provides the N+ type low resistance layer 7.

Figure 9:
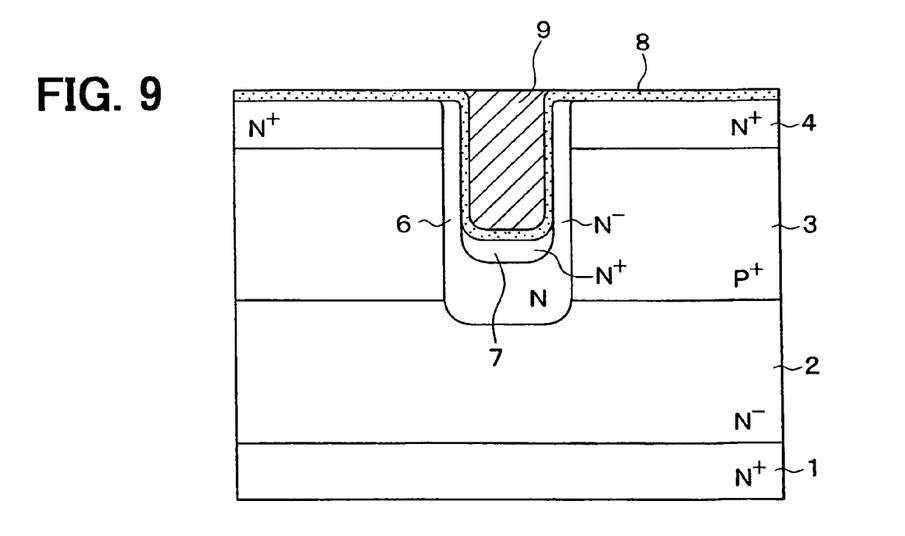
FIG. 9 is a cross sectional view explaining the manufacturing process of the vertical power MOSFET subsequent to FIG. 8.

<Step Shown in FIG. 9>

A poly silicon layer or a metallic layer doping with an impurity is formed on the surface of the oxide film 8. Then, the poly silicon layer or the metallic layer is etched back so that a part of the poly silicon layer or the metallic layer is remained for embedding the trench 5. Thus, the gate electrode 9 is provided.

Although the later steps are not shown in the drawings, an interlayer insulation film forming step, a contact hole forming step for contacting the interlayer insulation film, a wiring forming step and the like are performed. Accordingly, a gate wiring for connecting to the gate electrode 9 electrically is formed, and the first electrode 14 for electrically connecting to the N+ type source region 4 is formed, and then, the backside electrode 19 is formed on the backside of the N+ type substrate 1. Thus, the vertical power MOSFET shown in FIG. 1 is completed.

As described above, the vertical power MOSFET according to this embodiment provides such that electric field concentration is prevented from generating at the corner between the bottom and the sidewall of the trench 5, and that the oxide film 8 disposed at the corner is protected from breaking down.

Further, the above construction is manufactured only by entrenching the trench 5 near the boundary between the N− type drift layer 2 and the P+ type base region 3. Thus, it is not necessary to increase the depth of the trench 5. Furthermore, it is not necessary to form a N type layer under the P+ type base region 3 like as the prior art. Therefore, it is not necessary to add the additional step for forming the N type layer, so that the manufacturing process of the vertical power MOSFET is simplified.

Second Embodiment

Figure 11A:
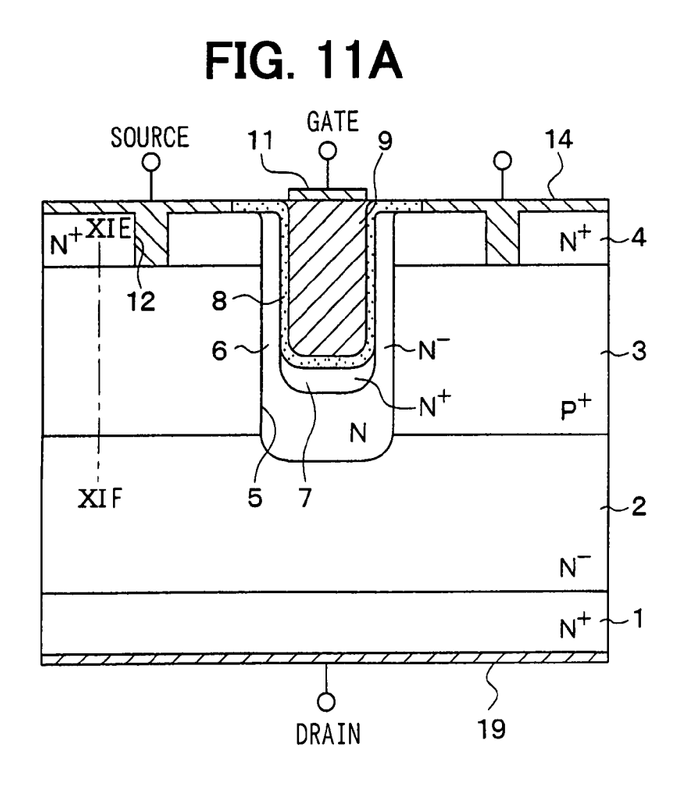
FIG. 11A is a cross sectional view showing a vertical power MOSFET according to a second embodiment of the present invention.
Figure 11B:
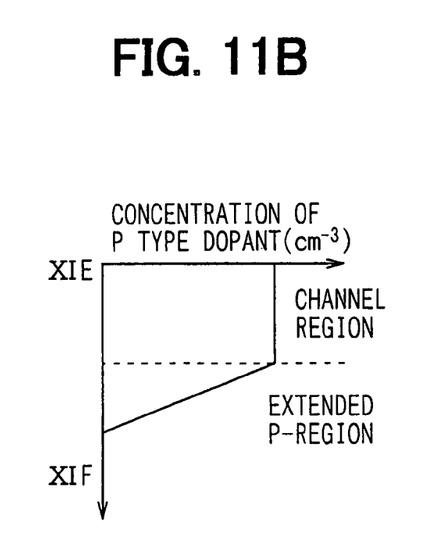
FIG. 11B is a graph showing a profile of a dopant concentration of a P conductivity type impurity in the vertical power MOSFET taken along line XIE-XIF in FIG. 11A.

A second embodiment of the present invention is explained as follows. FIG. 11A is a cross sectional view showing a MOSFET as a silicon carbide semiconductor device according to this embodiment. FIG. 11B is a profile of a dopant concentration of a P conductivity type impurity in the MOSFET along line XIE-XIF shown in FIG. 11A. The MOSFET according to this embodiment is explained with reference to FIGS. 11A and 11B as follows. The basic construction of the MOSFET according to this embodiment is similar to the first embodiment. Therefore, only the difference between them is explained.

In the second embodiment of the present invention, similar to the first embodiment, the P+ type base region 3 disposed on both sides of the trench 5 is arranged to be disposed on a lower side of the utmost lowest position of the oxide film 8. The impurity concentration of the P type impurity in the P+ type base region 3 is gradually reduced from the height of the position corresponding to the bottom of the N+ type low resistance layer 7 to the boundary between the N− type drift layer 2 and the P+ type base region 3, as shown in FIGS. 11A and 11B. Further, the impurity concentration of the N type impurity in the N− type channel layer 6 is lower than the impurity concentration of the N type impurity in the N+ type low resistance layer 7, and higher than the impurity concentration of the N type impurity in the N− type drift layer 2.

Thus, the above construction provides to improve the withstand voltage with maintaining the threshold of the gate channel in the MOSFET according to the first embodiment.

Third Embodiment

Figure 12A:
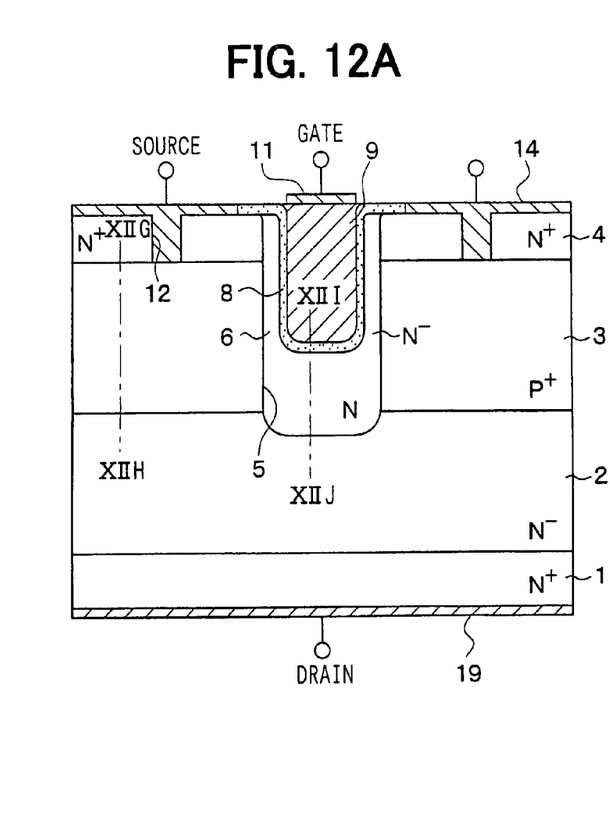
FIG. 12A is a cross sectional view showing a vertical power MOSFET according to a third embodiment of the present invention.
Figure 12B:
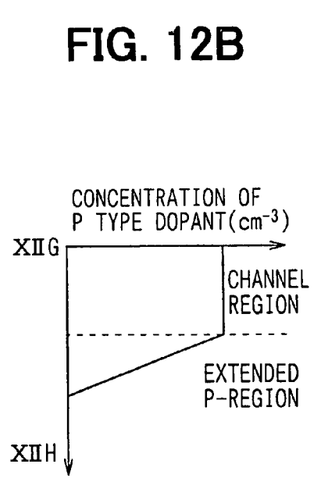
FIG. 12B is a graph showing a profile of a dopant concentration of a P conductivity type impurity in the vertical power MOSFET taken along line XIIG-XIIH in FIG. 12A.
Figure 12C:
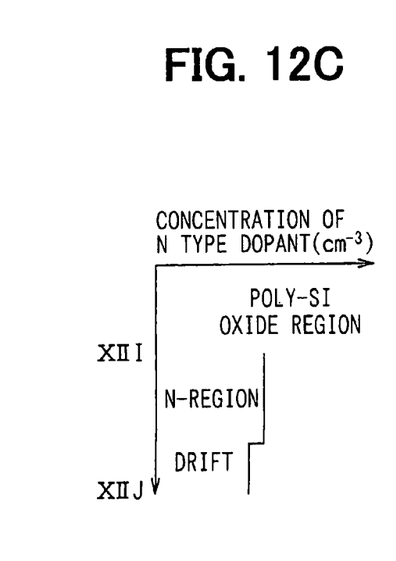
FIG. 12C is a graph showing a profile of a dopant concentration of a N conductivity impurity in the vertical power MOSFET taken along line XIII-XIIJ in FIG. 12A.

A third embodiment of the present invention is explained as follows. FIG. 12A is a cross sectional view showing a MOSFET as a silicon carbide semiconductor device according to this embodiment. FIG. 12B is a profile of a dopant concentration of a P conductivity type impurity in the MOSFET along line XIIG-XIIH shown in FIG. 12A, and FIG. 12C is a profile of a dopant concentration of a N conductivity type impurity in the MOSFET along line XIII-XIIJ shown in FIG. 12(a). The MOSFET according to this embodiment is explained with reference to FIGS. 12A to 12C as follows. The basic construction of the MOSFET according to this embodiment is similar to the first embodiment. Therefore, only the difference between them is explained.

In the third embodiment of the present invention, differently from the first embodiment, the construction includes no N+ type low resistance layer 7. Similar to the first embodiment, the P+ type base region 3 disposed on both sides of the trench 5 is arranged to be disposed on a lower side of the utmost lowest position of the oxide film 8. The impurity concentration of the P type impurity in the P+ type base region 3 is gradually reduced from the height of the position corresponding to the utmost bottom of the oxide film 8 in the trench 5 to the boundary between the N− type drift layer 2 and the P+ type base region 3. Further, the impurity concentration of the N type impurity in the N− type channel layer 6 is higher than the impurity concentration of the N type impurity in the N− type drift layer 2.

Thus, the above construction provides to improve the withstand voltage with maintaining the threshold of the gate channel in the MOSFET according to the first embodiment, although the on-state resistance becomes higher because the construction includes no N+ type low resistance layer 7.

Fourth Embodiment

Figure 13:
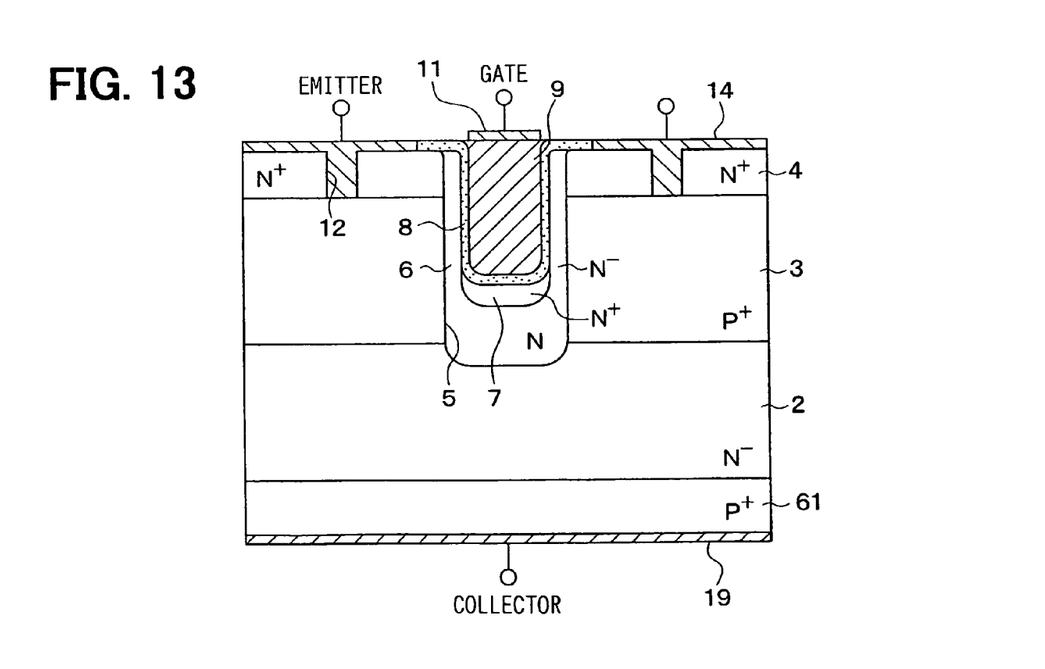
FIG. 13 is a cross sectional view showing an accumulation type vertical power MOSFET according to a fourth embodiment of the present invention.

A fourth embodiment of the present invention is explained as follows. FIG. 13 is a cross sectional view showing an IGBT as a silicon carbide semiconductor device according to this embodiment.

In the first embodiment, the silicon carbide semiconductor device is the vertical power MOSFET having the N+ type substrate 1 made of silicon carbide. On the other hand, as shown in FIG. 13, the device includes a P+ type substrate 61 instead of the substrate 1. Thus, the device is the IGBT instead of the power MOSFET. Here, in this case, the N+ type source region 4 described in the first embodiment works as a N+ type emitter region, the first electrode 14 works as an emitter electrode, and the second electrode 19 works as a collector electrode.

In a case of this IGBT, similar to the first embodiment, the P+ type base region 3 disposed on both sides of the trench 5 is positioned lower than the utmost lowest position of the oxide film 8, so that a junction structure having the N− type channel layer 6 sandwiched between two P+ type base regions 3 from both sides of the channel layer 6 is formed. Thus, the electric potential of the drain is interrupted by the junction structure so that the depletion layer is prevented from penetrating the upper portion of the $N^-$ type channel layer 6.

Thus, electric field concentration is prevented from generating at the corner between the bottom and the sidewall of the trench 5, so that the oxide film 8 at the corner is protected from breaking down. Thus, the fourth embodiment has the same effect as the first embodiment.

Fifth Embodiment

Figure 14:
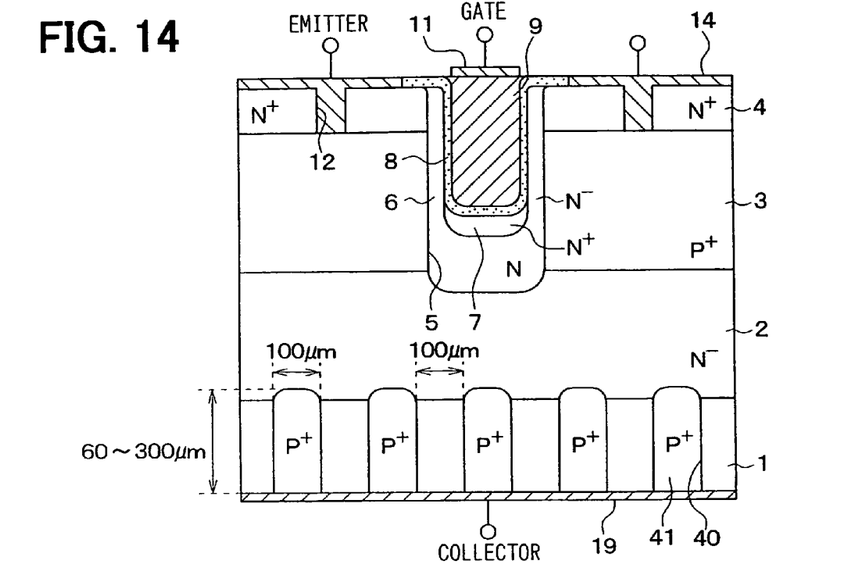
FIG. 14 is a cross sectional view showing an accumulation type vertical power MOSFET according to a fifth embodiment of the present invention.

A fifth embodiment of the present invention is explained. FIG. 14 is a cross sectional view showing an IGBT as a silicon carbide semiconductor device according to this embodiment. The IGBT according to this embodiment is explained as follows with reference to FIG. 14. The basic construction of the IGBT according to this embodiment is similar to the fourth embodiment. Therefore, only the difference between them is explained.

As shown in FIG. 14, in the IGBT according to this embodiment, the substrate 1 made of silicon carbide has the $N^+$ conductivity type. Multiple trenches 40 are formed from the backside of the $N^+$ type substrate 1 in the vertical direction so that the trenches reach the $N^-$ type drift layer 2. The $P^+$ type layer 41 is embedded in each trench 40. The above construction is different from the fourth embodiment.

A distance and a width of each $P^+$ type layer 41, i.e., each trench 41, are, for example, about 100 μm. The depth of the $P^+$ type layer 41 is, for example, in a range between 60 μm and 300 μm.

This construction is equivalent to a construction, in which a collector region composed of multiple $P^+$ type layers 41 includes multiple $N^+$ type regions. Accordingly, basically, the $P^+$ type layer 41 works as the collector region so that the IGBT is operated. Since the collector region includes multiple $N^+$ type regions, a threshold voltage generated at a SiC PN junction, i.e., in a PN potential between the $P^+$ type layer 41 and the $N^-$ type drift layer 2, can be eliminated. Here, in a case of 4H-SIC, the threshold voltage is 2.9 eV.

The IGBT having the above construction can be manufactured in such a manner that multiple $P^+$ type layers 41 are formed on the backside of the $N^+$ type substrate 1 shown in FIG. 4 of the first embodiment, and then, the manufacturing steps shown in FIGS. 5 to 9 are performed. Specifically, a mask having multiple openings corresponding to multiple-trench-to-be-formed position is disposed on the backside of the $N^+$ type substrate 1. Then, the backside of the $N^+$ type substrate 1 is etched so that multiple trenches 41 are formed. After that, the mask is removed, and then, a $P^+$ type film is deposited on the backside of the $N^+$ type substrate 1. The $P^+$ type film is etched back so that the $P^+$ type layer 41 is formed.

Sixth Embodiment

Figure 15:
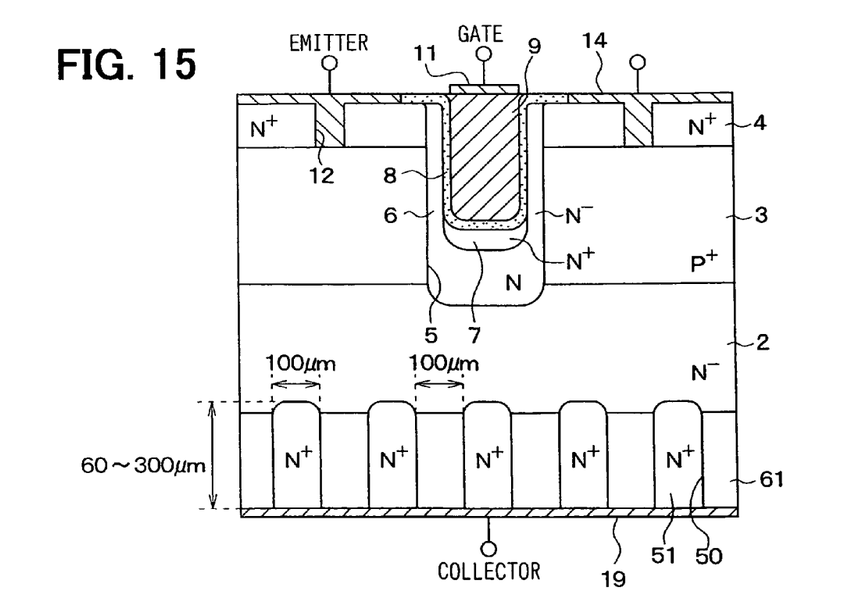
FIG. 15 is a cross sectional view showing an accumulation type vertical power MOSFET according to a sixth embodiment of the present invention.

A sixth embodiment of the present invention is explained. FIG. 15 is a cross sectional view showing an IGBT as a silicon carbide semiconductor device according to this embodiment. The IGBT according to this embodiment is explained as follows with reference to FIG. 15. The basic construction of the IGBT according to this embodiment is similar to the fifth embodiment. Therefore, only the difference between them is explained.

The IGBT according to this embodiment includes a silicon carbide substrate 61 having a $P^+$ conductivity type. Multiple trenches 50 are formed on the backside of the $P^+$ type substrate 61 in the vertical direction. The trenches 50 reach the $N^-$ type drift layer 2. An $N^+$ type layer 51 is embedded in each trench 50. The above construction is different from the third embodiment.

A distance and a width of each $N^+$ type layer 51, i.e., each trench 51, are, for example, about 100 μm. The depth of the $N^+$ type layer 51 is, for example, in a range between 60 μm and 300 μm.

This construction is equivalent to a construction, in which a collector region composed of multiple $P^+$ type substrate 61 includes multiple $N^+$ type regions 51. Accordingly, basically, the $P^+$ type substrate 61 works as the collector region so that the IGBT is operated. Since the collector region includes multiple $N^+$ type regions 51, a threshold voltage generated at a SiC PN junction, i.e., in a PN potential between the $P^+$ type substrate 61 and the $N^-$ type drift layer 2, can be eliminated.

The IGBT having the above construction can be easily manufactured in such a manner that the silicon carbide substrate 61 has the $P^+$ conductivity type differently from the fifth embodiment, and the $N^+$ type layer 51 is embedded in the trench 50 formed on the backside of the $P^+$ type substrate 61.

Modifications

In each embodiment, the first conductivity type is the N type, and the second conductivity type is the P type. Further, the vertical power MOSFET and the IGBT having the N channel type for forming the N type channel are explained as an example. However, the first conductivity type can be the P type, and the second conductivity type can be the N type, so that a vertical power MOSFET and an IGBT having a P channel type for forming a P type channel is provided.

In each embodiment, the substrate includes the $P^+$ type base region 3 and the $N^+$ type source region 4 formed by an epitaxial growth method. However, they can be formed by an ion implantation method.

Here, in a case where an orientation of crystal is shown, in general, a bar (i.e., -) should be added over an intended numeral. Since an expressional limitation according to an electric filing system exists, in this specification, the bar is added in front of the intended numeral.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A silicon carbide semiconductor device comprising:
   a semiconductor substrate including a silicon carbide substrate having a first conductive type or a second conductive type, a first semiconductor layer made of the first conductive type silicon carbide and having an impurity concentration lower than an impurity concentration of the silicon carbide substrate, a second semiconductor layer made of a second conductive type silicon carbide, and a third semiconductor layer made of the first conductive type silicon carbide, which are stacked in this order from the semiconductor substrate to the third semiconductor layer;
   a trench disposed in a cell region of the semiconductor substrate and penetrating the second and the third semiconductor layers to contact the first semiconductor layer;
   a channel layer having the first conductive type and disposed on a sidewall and a bottom of the trench;

an oxide film disposed on the channel layer in the trench and including a part for functioning as a gate oxide film;

a gate electrode disposed on a surface of the oxide film in the trench;

a first electrode electrically connecting to the third semiconductor layer; and a second electrode electrically connecting to the silicon carbide substrate, wherein any position of a boundary between the first semiconductor layer and the second semiconductor layer is disposed lower than an utmost lowest position of the oxide film in the trench, the silicon carbide substrate has the first conductive type, a plurality of second trenches are disposed in the silicon carbide substrate, each second trench being disposed from a backside of the silicon carbide substrate to the first semiconductor layer, each of the second trenches is embedded with an impurity layer having the second conductive type, and the second electrode contacts the silicon carbide substrate and the impurity layer in each of the second trenches, and wherein each of the second trenches penetrates the silicon carbide substrate so that the impurity layer in each of the second trenches contacts the first semiconductor layer.

2. The silicon carbide semiconductor device of claim 1, wherein the channel layer covers an entirety of the bottom of the trench.

3. The silicon carbide semiconductor device of claim 1, wherein a thickness of the channel layer on the bottom of the trench is greater than a thickness of the channel layer on the sidewall of the trench.

4. The silicon carbide semiconductor device of claim 1, wherein the gate electrode comprises a single electrode disposed on the surface of the oxide film in the trench.

5. The silicon carbide semiconductor device of claim 1, wherein the gate electrode comprises the only electrode disposed in the trench.

* * * * *